(12) United States Patent
Chang et al.

(10) Patent No.: US 12,614,927 B2
(45) Date of Patent: Apr. 28, 2026

(54) SELF-POWERED DISPLAY DEVICE

(71) Applicant: Iris Optronics Co., Ltd., Tainan City (TW)

(72) Inventors: Chung Yi Chang, Tainan City (TW); Chi Chang Liao, Tainan City (TW)

(73) Assignee: Iris Optronics Co., Ltd., Tainan City (TW)

( * ) Notice: Subject to any disclaimer, the term of this patent is extended or adjusted under 35 U.S.C. 154(b) by 0 days.

(21) Appl. No.: 18/948,558

(22) Filed: Nov. 15, 2024

(65) Prior Publication Data

US 2025/0373084 A1     Dec. 4, 2025

(30) Foreign Application Priority Data

May 30, 2024     (TW) .................................. 113120116

(51) Int. Cl.
| | |
|---|---|
| *H02J 50/30* | (2016.01) |
| *H02S 40/22* | (2014.01) |
| *H10K 39/00* | (2023.01) |
| *H10K 39/10* | (2023.01) |
| *G02F 1/133* | (2006.01) |

(52) U.S. Cl.
CPC .............. *H02J 50/30* (2016.02); *H02S 40/22* (2014.12); *H10K 39/10* (2023.02); *H10K 39/601* (2023.02); *G02F 1/133* (2013.01); *G02F 2203/01* (2013.01)

(58) Field of Classification Search
CPC .......... H02J 50/30; H02S 40/22; H10K 39/10; H10K 39/601; G02F 1/133; G02F 2203/01
See application file for complete search history.

(56) References Cited

U.S. PATENT DOCUMENTS

| | | |
|---|---|---|
| 2011/0285942 A1 | 11/2011 | Guo et al. |
| 2012/0105780 A1 | 5/2012 | Jhan et al. |
| 2015/0255651 A1 | 9/2015 | Barr et al. |
| 2025/0103116 A1* | 3/2025 | Lombardi ............. H02J 7/0048 |

FOREIGN PATENT DOCUMENTS

| | | |
|---|---|---|
| JP | H11-119190 A | 4/1999 |
| JP | 2004-191645 A | 7/2004 |
| JP | 2007-065020 A | 3/2007 |

(Continued)

*Primary Examiner* — Michael Y Sun
(74) *Attorney, Agent, or Firm* — CKC & Partners Co., LLC

(57)     ABSTRACT

A self-powered display device is proposed, and includes a substrate, a first photoelectric conversion unit, a light-transmitting display module and a wireless charging module. The first photoelectric conversion unit is disposed on the substrate and located in a display region. The light-transmitting display module is stacked on the first photoelectric conversion unit. A first light penetrates the light-transmitting display module, and the first photoelectric conversion unit converts the first light into a first electrical energy and provides the first electrical energy to the light-transmitting display module. The wireless charging module is disposed on the substrate and located in a non-display region. The wireless charging module receives a second light and converts the second light into a second electrical energy, and provides the second electrical energy to the light-transmitting display module. A wavelength range of the first light is different from a wavelength range of the second light.

7 Claims, 10 Drawing Sheets

(56)    References Cited

FOREIGN PATENT DOCUMENTS

| JP | 2008-15102 A | 1/2008 |
| JP | 2016-142827 A | 8/2016 |
| JP | 2022-109273 A | 7/2022 |
| KR | 10-2013-0132669 A | 12/2013 |
| WO | 2012/060246 A1 | 5/2012 |
| WO | WO-2012060073 A1 * | 5/2012 | ............ H10F 19/80 |
| WO | 2018/034277 A1 | 2/2018 |

* cited by examiner

SELF-POWERED DISPLAY DEVICE

RELATED APPLICATIONS

This application claims priority to Taiwan Application Serial Number 113120116, filed May 30, 2024, which is herein incorporated by reference.

BACKGROUND

Technical Field

The present disclosure relates to a display device. More particularly, the present disclosure relates to a self-powered display device.

Description of Related Art

In addition to reflecting ambient light to provide an image, one of the characteristics of a transflective display, such as a cholesteric liquid crystal display (ChLCD), is to allow part of ambient light to penetrate to the bottom of the transflective display. By combining a solar device at the bottom, the transflective display can make full use of ambient light to achieve its self-powered function. Although bistable ChLCD is absolutely power-saving, the solar panel installed below ChLCD can only capture part of the light that penetrates ChLCD to generate power. The multi-functional applications of ChLCD are still limited by the power, such as frequent screen updates, communication functions, or use in spaces with insufficient ambient light. However, if expanding the wireless charging function on the same solar panel to increase power generation, it still encounters the problem that the solar cells for absorbing the ambient light and the solar cells used for wireless charging have different absorption bands.

In view of this, how to develop a self-powered display device with wireless charging function, simple production process and low manufacturing cost has become an urgent problem that related industries want to solve currently.

SUMMARY

According to one aspect of the present disclosure, a self-powered display device includes a substrate, a first photoelectric conversion unit, a light-transmitting display module and a wireless charging module. The substrate has a display region and a non-display region. The first photoelectric conversion unit is disposed on the substrate and located in the display region. The light-transmitting display module is stacked on the first photoelectric conversion unit and configured to receive a first light. The first light penetrates the light-transmitting display module and enters the first photoelectric conversion unit, and the first photoelectric conversion unit converts the first light into a first electrical energy and provides the first electrical energy to the light-transmitting display module. The wireless charging module is disposed on the substrate and located in the non-display region. The wireless charging module is configured to receive a second light and converts the second light into a second electrical energy, and the wireless charging module provides the second electrical energy to the light-transmitting display module. A wavelength range of the first light is different from a wavelength range of the second light.

According to another aspect of the present disclosure, a self-powered display device includes a substrate, a first photoelectric conversion unit, a light-transmitting display module and a wireless charging module. The substrate has a display region and a non-display region. The first photoelectric conversion unit is disposed on the substrate and located in the display region. The light-transmitting display module is stacked on the first photoelectric conversion unit and configured to receive a first light. The first light penetrates the light-transmitting display module and enters the first photoelectric conversion unit, and the first photoelectric conversion unit converts the first light into a first electrical energy and provides the first electrical energy to the light-transmitting display module. The wireless charging module is configured to receive a second light, and includes a second photoelectric conversion unit and a retroreflector. The second photoelectric conversion unit is disposed on the substrate and located in the non-display region. The retroreflector is detachably disposed on the substrate and covers the second photoelectric conversion unit. A part of the second light penetrates the retroreflector and enters the second photoelectric conversion unit, and the second photoelectric conversion unit converts the part of the second light into a second electrical energy and provides the second electrical energy to the light-transmitting display module. A wavelength range of the first light is the same as a wavelength range of the second light.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected" to another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1A:
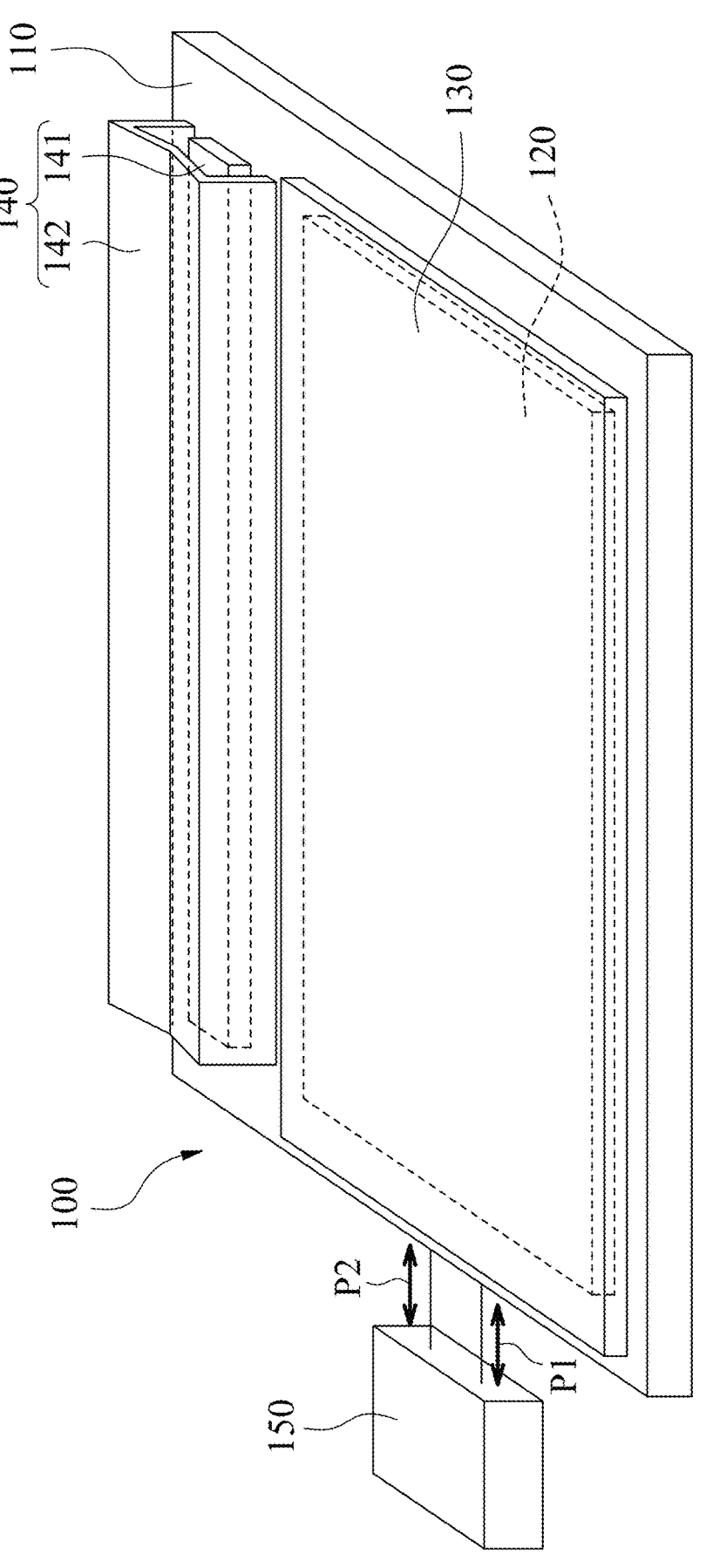
FIG. 1A shows a three-dimensional schematic view of a self-powered display device according to a first example of a first embodiment of the present disclosure.
Figure 1B:
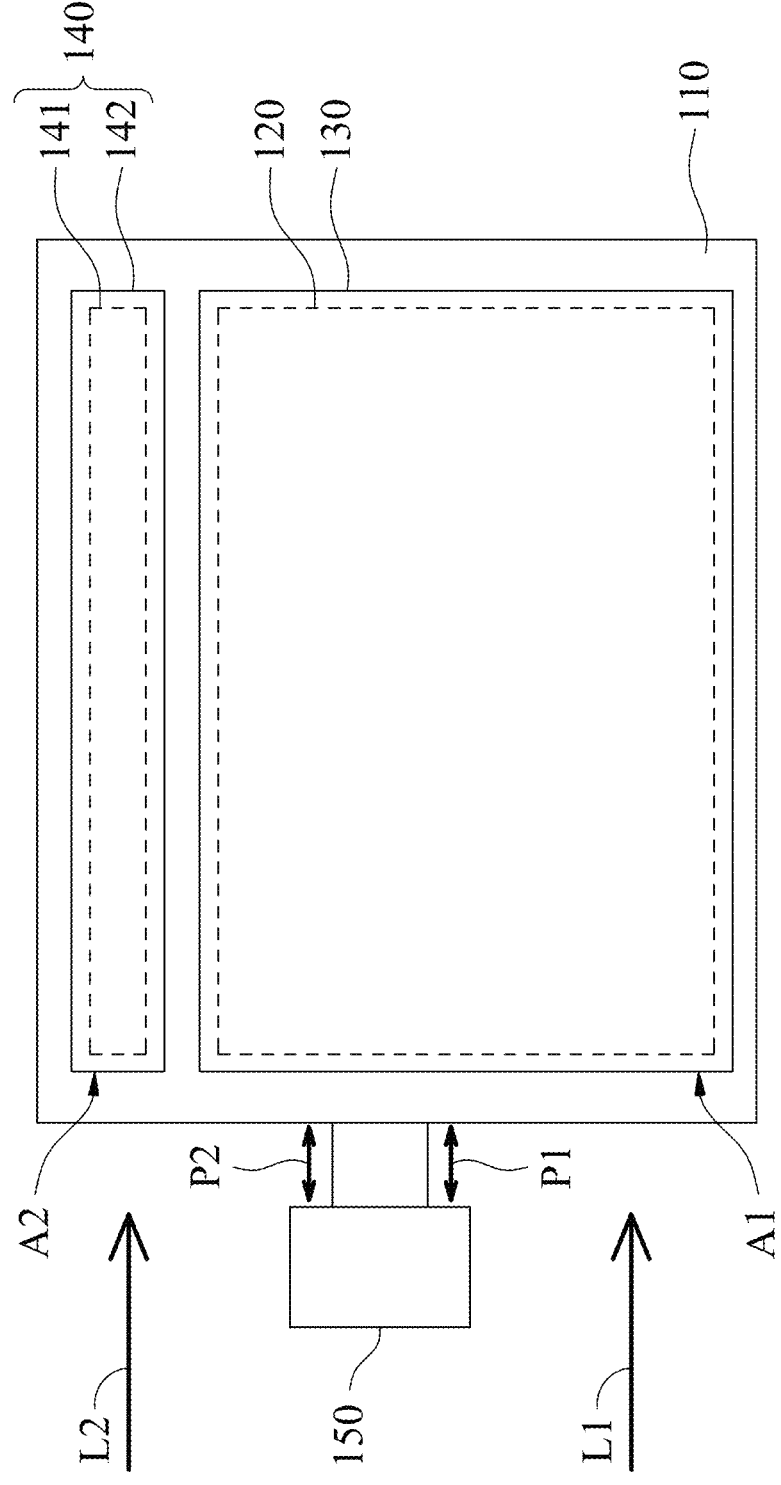
FIG. 1B shows a partially transparent top view of the self-powered display device in FIG. 1A.
Figure 1C:
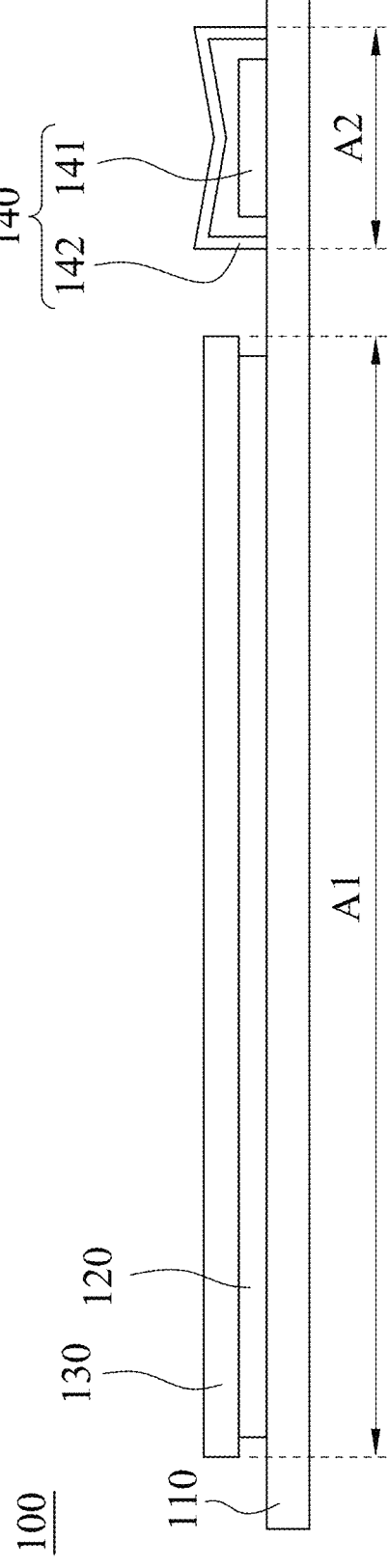
FIG. 1C shows a cross-sectional view of the self-powered display device in FIG. 1A.

Please refer to FIGS. 1A, 1B and 1C. FIG. 1A shows a three-dimensional schematic view of a self-powered display device according to a first example of a first embodiment of the present disclosure. FIG. 1B shows a partially transparent top view of the self-powered display device in FIG. 1A. FIG. 1C shows a cross-sectional view of the self-powered display device in FIG. 1A. As shown in FIGS. 1A to 1C, a self-powered display device 100 includes a substrate 110, a first photoelectric conversion unit 120, a light-transmitting display module 130 and a wireless charging module 140.

The substrate 110 has a display region A1 and a non-display region A2. The display region A1 is adjacent to the non-display region A2, and an area of the display region A1 is larger than an area of the non-display region A2. The first photoelectric conversion unit 120 is disposed on the substrate 110 and located in the display region A1. The light-transmitting display module 130 is electrically connected and stacked on the first photoelectric conversion unit 120. An outer peripheral edge of the light-transmitting display module 130 is aligned with the display region A1, that is, an area of the top of the light-transmitting display module 130 is the same as an area of the display region A1. The light-transmitting display module 130 is configured to receive a first light L1 from outside the self-powered display device 100, and the first light L1 penetrates the light-transmitting display module 130 and enters the first photoelectric conversion unit 120. The first photoelectric conversion unit 120 converts the first light L1 into a first electrical energy P1 and provides the first electrical energy P1 to the light-transmitting display module 130 through its internal conductive wires (not shown). The wireless charging module 140 is disposed on the substrate 110 and located in the non-display region A2. A projected area of the wireless charging module 140 on the non-display region A2 is the same as an area of the non-display region A2. The wireless charging module 140 is configured to receive a second light L2 and converts the second light L2 into a second electrical energy P2. The wireless charging module 140 provides the second electrical energy P2 to the light-transmitting display module 130 through conductive wires (not shown) inside the substrate 110. In some embodiments, the wireless charging module 140 can also be directly connected to the light-transmitting display module 130 and transmits the second electrical energy P2 from itself to the light-transmitting display module 130.

In addition, a wavelength range of the first light L1 is different from a wavelength range of the second light L2. The first light L1 can be outdoor or indoor ambient light, and its wavelength range is between 400 nm and 700 nm. The second light L2 can be an infrared radiation (IR), and its wavelength range is between 700 nm and 2500 nm. Thus, the self-powered display device 100 of the present disclosure respectively absorbs the first light L1 and the second light L2 in different wavelength ranges by the first photoelectric conversion unit 120 and the wireless charging module 140 disposed on the substrate 110, and generates the first electric energy P1 and the second electric energy P2 to achieve the effect of increasing the power generation. Therefore, the self-powered display device 100 can use the wireless charging function to solve the problem in the prior art that the solar panel can only capture part of the light penetrating the display to generate power, resulting in insufficient power generation to provide multi-functional applications of the display.

In some embodiments, the substrate 110 can be a backplane with stiffness and multiple signal traces for transmitting control signals. The first photoelectric conversion unit 120 can be, but is not limited to, a silicon solar cell, a thin film solar cell, an organic solar cell (i.e., organic photovoltaic (OPV)), a perovskite solar cell (PSC) or a dye sensitized solar cell (DSSC), or other solar cells that can convert the first light L1 with the wavelength range between 400 nm and 700 nm into the first electrical energy P1.

The light-transmitting display module 130 can be, but is not limited to, a cholesteric liquid crystal display (ChLCD), a transflective liquid crystal display, or a transparent organic light-emitting diode (OLED) display or a transparent light-emitting diode (LED) display, or other displays that have the functions of displaying images and allowing the first light L1 to penetrate. In this embodiment, the light-transmitting display module 130 is ChLCD, and has two stable states: a focal conic state and a planar state. By applying different voltages to the light-transmitting display module 130, the arrangement state of the cholesterol liquid crystal molecules can be controlled to switch between the focal conic state and the planar state. When the light-transmitting display module 130 is in the planar state, the cholesteric liquid crystal molecules are arranged neatly, so that the first light L1 is reflected to display an image. When the light-transmitting display module 130 is in the focal conic state, the cholesteric liquid crystal molecules are arranged in a disordered manner, so that the first light L1 can penetrate to the bottom of the light-transmitting display module 130 and be absorbed by the first photoelectric conversion unit 120.

Figure 2:
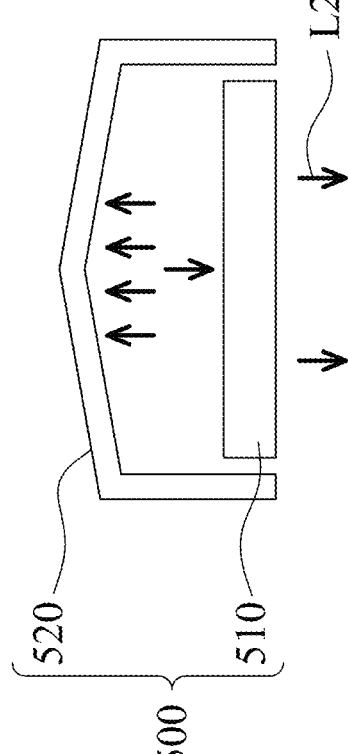
FIG. 2 shows a schematic view of a wireless charging module of this disclosure performing wireless charging.
Figure 2:
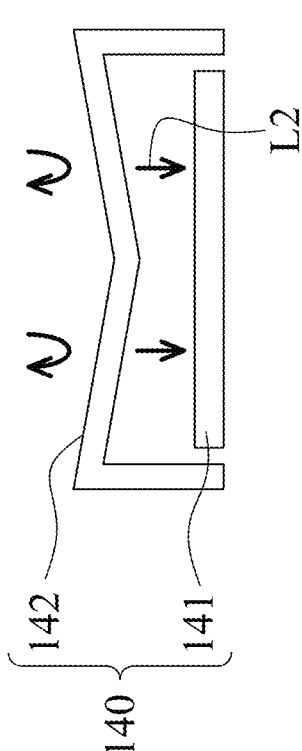

Please refer to FIGS. 1A to 1C and 2. FIG. 2 shows a schematic view of the wireless charging module of this disclosure performing wireless charging. As shown in FIGS. 1A to 1C and 2, the wireless charging module 140 can be a light receiver used to absorb light radiation in wireless charging technology, and can include a second photoelectric conversion unit 141 and a retroreflector 142. The second photoelectric conversion unit 141 can be, but is not limited to, a silicon crystal solar cell, a thin film solar cell, an organic solar cell, a perovskite solar cell or a dye sensitized solar cell, or other solar cells that can convert the second light L2 with the wavelength range between 700 nm and 2500 nm into the second electrical energy P2. However, the second photoelectric conversion unit 141 is different from the first photoelectric conversion unit 120, that is, the second photoelectric conversion unit 141 and the first photoelectric conversion unit 120 are different types of solar cells. The second photoelectric conversion unit 141 is disposed on the substrate 110 and located in the non-display region A2. The retroreflector 142 is detachably disposed on the substrate 110 and covers the second photoelectric conversion unit 141. A part of the second light L2 can penetrate the retroreflector 142 and enters the second photoelectric conversion unit 141, so that the second photoelectric conversion unit 141 converts the part of the second light L2 into the second electrical energy P2.

In FIG. 2, the second light L2 is generated by a light emitter 500 located outside the self-powered display device 100. The light emitter 500 includes a laser gain medium 510 and another retroreflector 520. One side of the laser gain medium 510 faces the wireless charging module 140, and the retroreflector 520 is disposed adjacent to the other side of the laser gain medium 510. The laser gain medium 510 can be composed of a semiconductor material, such as gallium aluminum arsenide (GaAlAs). When an electrical excitation (e.g., an input voltage) is input to the laser gain medium 510, population inversion occurs in the laser gain medium 510, causing the laser gain medium 510 to emit multiple photons toward the wireless charging module 140. The photons form the second light L2, and the second light L2 is incident on the retroreflector 142 of the wireless charging module 140. Based on the optical characteristics of the retroreflector 142 (e.g., the reflectivity of the retroreflector 142 can be, but is not limited to 95%), most of the second light L2 is reflected back to the laser gain medium 510 along the incident path, and the remaining second light L2 penetrates the retroreflector 142 and is absorbed by the second photoelectric conversion unit 141 to be converted into second electrical energy P2.

In detail, the laser gain medium 510 is a component with high gain, miniaturization and high efficiency. Using infrared radiations as the source of wireless charging is the best option because it is easy to be converted into the electrical energy. Therefore, the selected wavelength range of the light converted by the wireless charging module 140 is preferably between 700 nm and 2500 nm. The laser gain medium 510 can be used to amplify the second light L2 reflected by the retroreflector 142. In other words, after receiving the second light L2 reflected by the retroreflector 142, the laser gain medium 510 can emit more photons with the same quantum parameters (e.g., direction, wavelength, phase) to the retroreflector 520, thereby amplifying the second light L2 reflected by the retroreflector 142. Then, the second light L2 strikes the retroreflector 520 and is totally reflected from the retroreflector 520 back to the laser gain medium 510 based on the optical characteristics of the retroreflector 520 (e.g., the reflectivity of the retroreflector 520 can be, but is not limited to 100%). The second light L2 passes through the laser gain medium 510 again and its radiation is amplified over and over, and then the second light L2 returns along the incident path and partially penetrates the retroreflector 142. Therefore, the part of the second light L2 is converted into the second electrical energy P2 by the second photoelectric conversion unit 141 again. The retroreflector 142 and the retroreflector 520 form a resonant cavity in free space. As long as the light amplification of the laser gain medium 510 is sufficient to compensate for the part of the second light L2 converted into the second electrical energy P2 and the light path loss, the wireless charging process proceed continuously. Thus, the self-powered display device 100 of the present disclosure uses optical radiations as the source of wireless charging and have the following advantages: (1) high photoelectric conversion efficiency; (2) regardless of the distance between the light emitter 500 and the wireless charging module 140, the photoelectric conversion efficiency is almost constant; (3) wireless charging is not affect wireless networks (Wi-Fi), bluetooth or other electronic communication methods; and (4) the non-display region A2 has a small screen-to-body ratio and is mainly used to absorb laser sources, such as infrared radiations, and infrared radiations have low air loss and high safety.

In addition, the self-powered display device 100 can further include a power storage module 150, such as a rechargeable battery. The power storage module 150 is electrically connected to the first photoelectric conversion unit 120 and the second photoelectric conversion unit 141 of the wireless charging module 140 through the conductive wires inside the substrate 110. Therefore, the power storage module 150 can be configured to receive and store the first electrical energy P1 and the second electrical energy P2, and provide the first electrical energy P1 and the second electrical energy P2 to the light-transmitting display module 130 through the substrate 110.

Figure 3A:
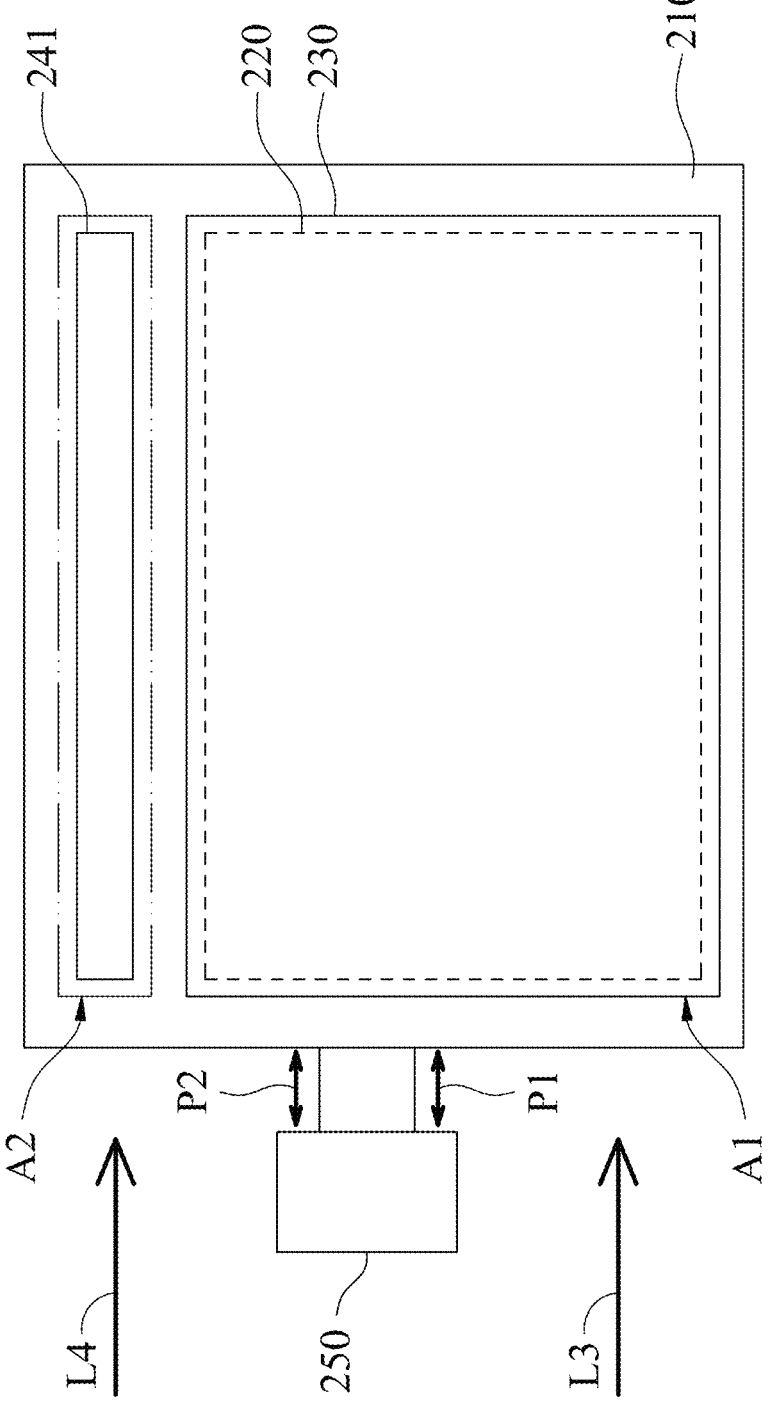
FIG. 3A shows a partially transparent top view of a self-powered display device according to a second example of the first embodiment of the present disclosure.
Figure 3B:
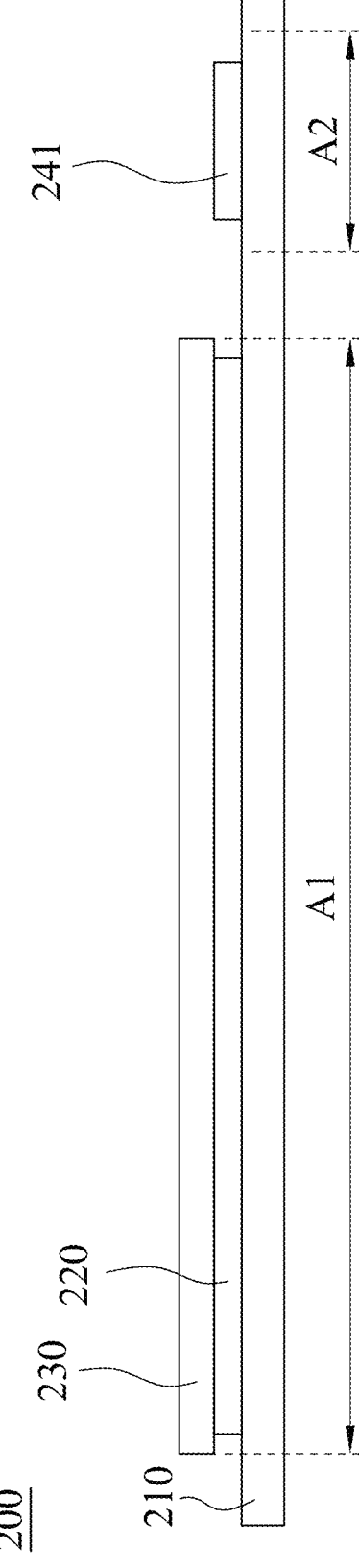
FIG. 3B shows a cross-sectional view of the self-powered display device in FIG. 3A.

Please refer to FIGS. 3A and 3B. FIG. 3A shows a partially transparent top view of a self-powered display device according to a second example of the first embodiment of the present disclosure. FIG. 3B shows a cross-sectional view of the self-powered display device in FIG. 3A. As shown in FIGS. 3A and 3B, a self-powered display device 200 includes a substrate 210, a first photoelectric conversion unit 220, a light-transmitting display module 230, a second photoelectric conversion unit 241 and a power storage module 250, and the second photoelectric conversion unit 241 is different from the first photoelectric conversion unit 220. Each component of the self-powered display device 200 is the same as the corresponding component in the self-powered display device 100 in FIGS. 1A to 1C, so the same structural configurations and component functions are not be described again.

Different from the self-powered display device 100, the self-powered display device 200 does not have a retroreflector installed on the substrate 210. Specifically, in application fields where wireless charging is not required, the retroreflector can be removed from the non-display region A2 of the substrate 210. The first photoelectric conversion unit 220 located in the display region A1 can convert a first light L3 incident from the outside of the self-powered display device 200 into a first electrical energy P1, and a wavelength range of the first light L3 is between 400 nm and 700 nm. In particular, the second photoelectric conversion unit 241 located in the non-display region A2 can directly absorb a second light L4 with a wavelength range between 400 nm and 2500 nm, and convert the second light L4 into the second electrical energy P2, which represents that the second photoelectric conversion unit 241 can not only absorb and convert general visible light, but also absorb and convert infrared radiations with longer wavelengths in sunlight, thereby achieving the purpose of increasing power generation.

Figure 4:
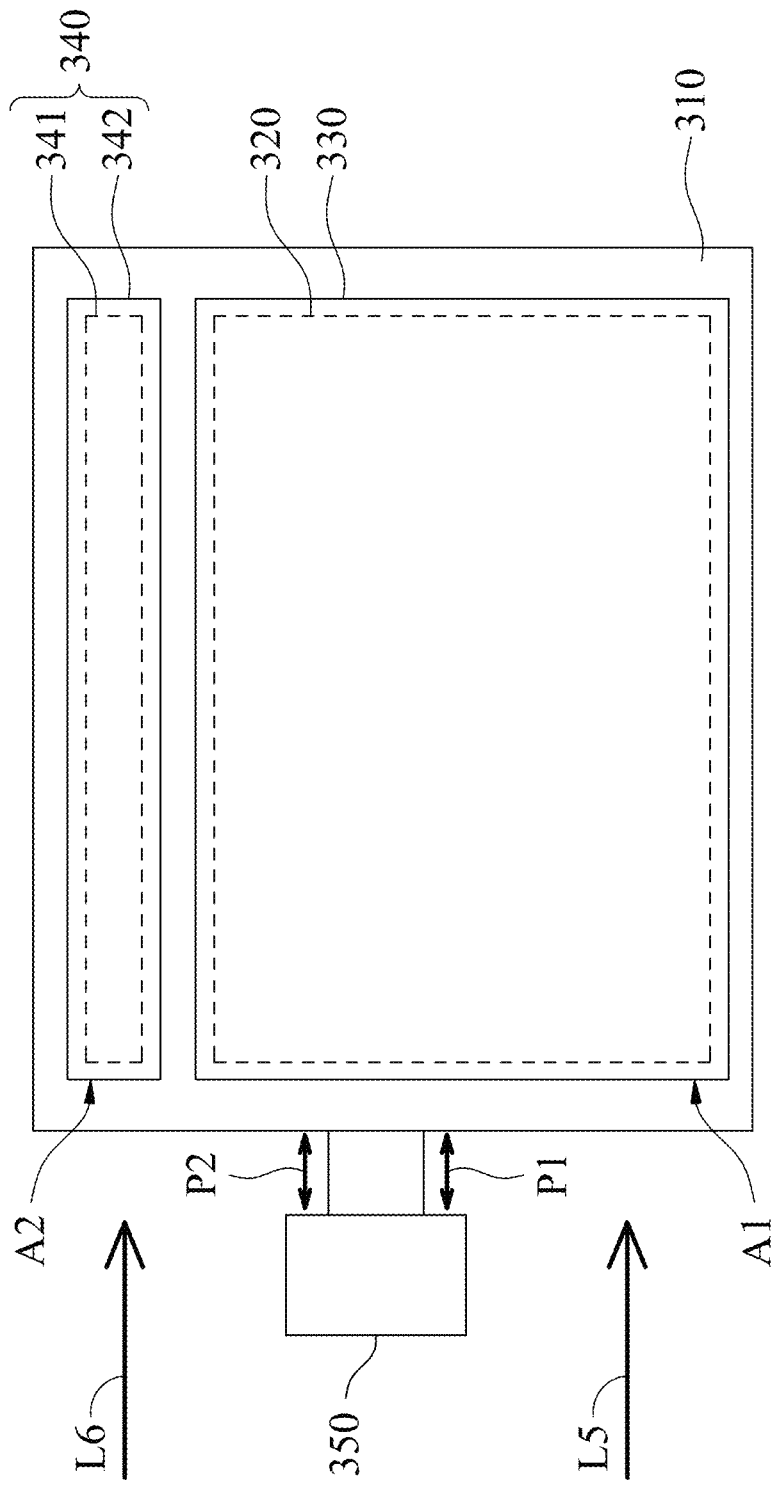
FIG. 4 shows a partially transparent top view of a self-powered display device according to a first example of a second embodiment of the present disclosure.

Please refer to FIG. 4. FIG. 4 shows a partially transparent top view of a self-powered display device according to a first example of a second embodiment of the present disclosure. As shown in FIG. 4, a self-powered display device 300 includes a substrate 310, a first photoelectric conversion unit 320, a light-transmitting display module 330, a wireless charging module 340 and a power storage module 350.

The substrate 310 has a display region A1 and a non-display region A2. The first photoelectric conversion unit 320 is disposed on the substrate 310 and located in the display region A1. The light-transmitting display module 330 is stacked on the first photoelectric conversion unit 320 and configured to receive a first light L5. The first light L5 penetrates the light-transmitting display module 330 and enters the first photoelectric conversion unit 320. The first photoelectric conversion unit 320 converts the first light L5 into a first electrical energy P1 and provides the first electrical energy P1 to the light-transmitting display module 330. The wireless charging module 340 is configured to receive a second light L6, and includes a second photoelectric conversion unit 341 and a retroreflector 342. The second photoelectric conversion unit 341 is disposed on the substrate 310 and located in the non-display region A2. The retroreflector 342 is detachably disposed on the substrate 310 and covers the second photoelectric conversion unit 341. A part of the second light L6 penetrates the retroreflector 342 and enters the second photoelectric conversion unit 341. The second photoelectric conversion unit 341 converts the part of the second light L6 into a second electrical energy P2 and provides the second electrical energy P2 to the light-transmitting display module 330. Specifically, except for the first photoelectric conversion unit 320 and the second photoelectric conversion unit 341, the remaining components in the self-powered display device 300 are the same as the corresponding components in the self-powered display device 100 in FIG. 1B, so the same structural configurations and component functions are not be described again.

Different from the self-powered display device 100, both of the first photoelectric conversion unit 320 and the second photoelectric conversion unit 341 of the self-powered display device 300 are organic solar cells or perovskite solar cells, which represent that the first photoelectric conversion unit 320 and the second photoelectric conversion unit 341 are the same types of solar cells. In this embodiment, a wavelength range of the first light L5 absorbed by the first photoelectric conversion unit 320 is the same as a wavelength range of the second light L6 absorbed by the second photoelectric conversion unit 341, and the wavelength range of the first light L5 and the wavelength range of the second light L6 are both between 400 nm and 800 nm. The aforementioned configuration is based on the following reasons.

In general, the absorption bands of the solar cells on the back of the display and the solar cells used for wireless charging are completely different. The main absorption band of the solar cells on the back of the display is between 400 nm and 700 nm, which is visible light. The main absorption band of solar cells for wireless charging is between 700 nm and 2500 nm, which is infrared radiation. If two solar cells with different types are respectively arranged in the display region A1 and the non-display region A2, the substrate 310 should need to be equipped with different charging chips based on different electrical properties of the two solar cells to collect the converted electrical energy, so that the charging chips can boost and store the electrical energy in the power storage module 350. On the other hand, if two solar cells with the same type are respectively arranged in the display region A1 and the non-display region A2, that is, if the first photoelectric conversion unit 320 and the second photoelectric conversion unit 341 are configured as the same solar cell, the issue of spectral matching needs to be considered.

Figure 5:
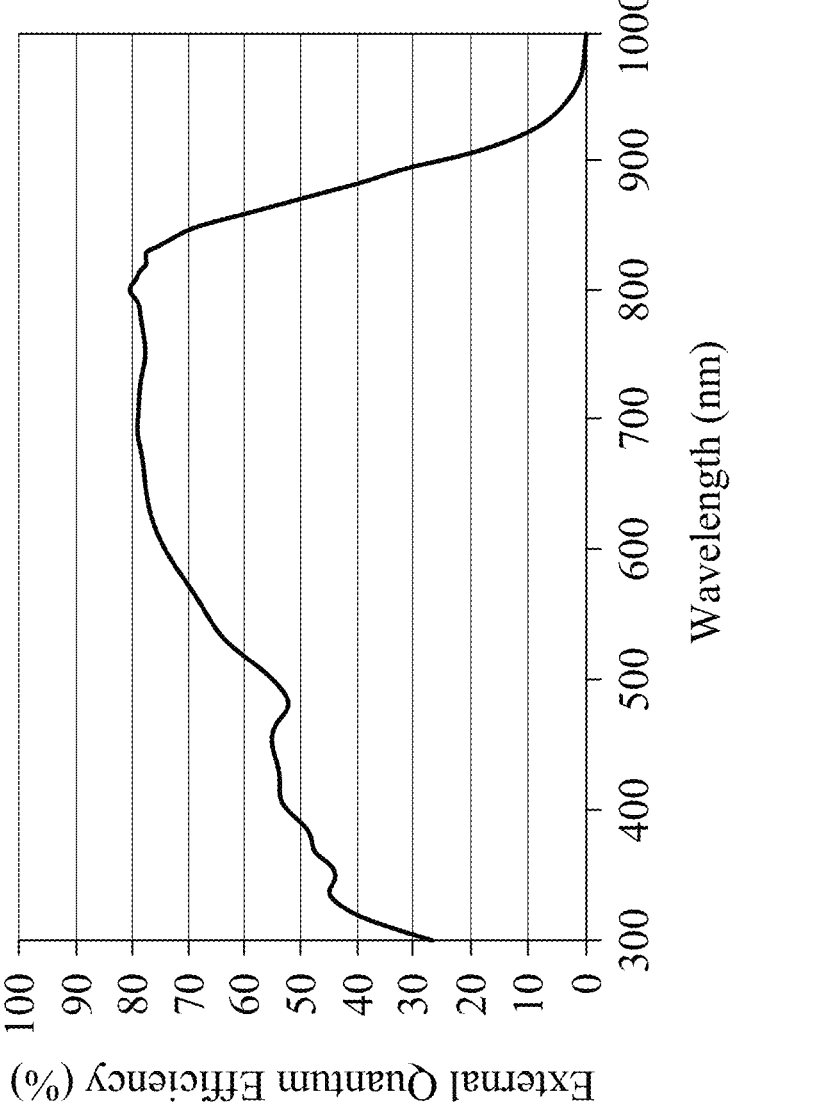
FIG. 5 shows an external quantum efficiency spectrum of both of a first photoelectric conversion unit and a second photoelectric conversion unit of the present disclosure being organic solar cells.
Figure 6:
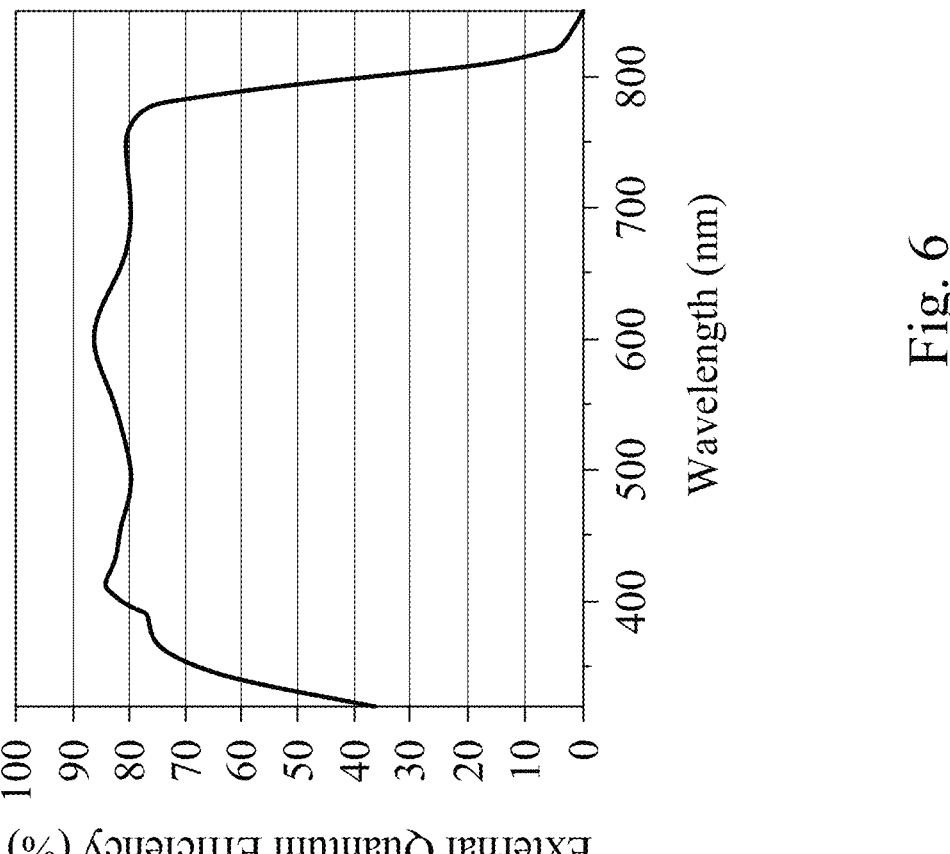
FIG. 6 shows an external quantum efficiency spectrum of both of the first photoelectric conversion unit and the second photoelectric conversion unit of the present disclosure being perovskite solar cells.

Please refer to FIGS. 5 and 6. FIG. 5 shows an external quantum efficiency (EQE) spectrum of both of a first photoelectric conversion unit and a second photoelectric conversion unit of the present disclosure being organic solar cells. FIG. 6 shows an external quantum efficiency spectrum of both of the first photoelectric conversion unit and the second photoelectric conversion unit of the present disclosure being perovskite solar cells. It should be noted that in this embodiment, the light-transmitting display module 330 is a cholesteric liquid crystal display, which has higher transmittance for a light with a wavelength range between 600 nm and 780 nm. Therefore, the first photoelectric conversion unit 320 needs to use a solar cell whose the external quantum efficiency can produce higher power generation for the light with the wavelength range between 600 nm and 780 nm. Further, in order to improve the charging efficiency of the wireless charging module 340, the second photoelectric conversion unit 341 must also use a solar cell with higher external quantum efficiency in the infrared band. In FIG. 5, when both of the first photoelectric conversion unit 320 and the second photoelectric conversion unit 341 are organic solar cells, the external quantum efficiency of the self-powered display device 300 in the wavelength range between 400 nm and 800 nm can be 50%~80%. In FIG. 6, when both of the first photoelectric conversion unit 320 and the second photoelectric conversion unit 341 are perovskite solar cells, the external quantum efficiency of the self-powered display device 300 in the wavelength range between 400 nm and 800 nm can also be 50%~80%. Thus, the self-powered display device 300 of the present disclosure not only realizes the wireless charging function, but also can reduce the production process, the cost and simplify the circuit design inside the device by configuring the solar cells with the same type in the display region A1 and the non-display region A2.

Figure 7:
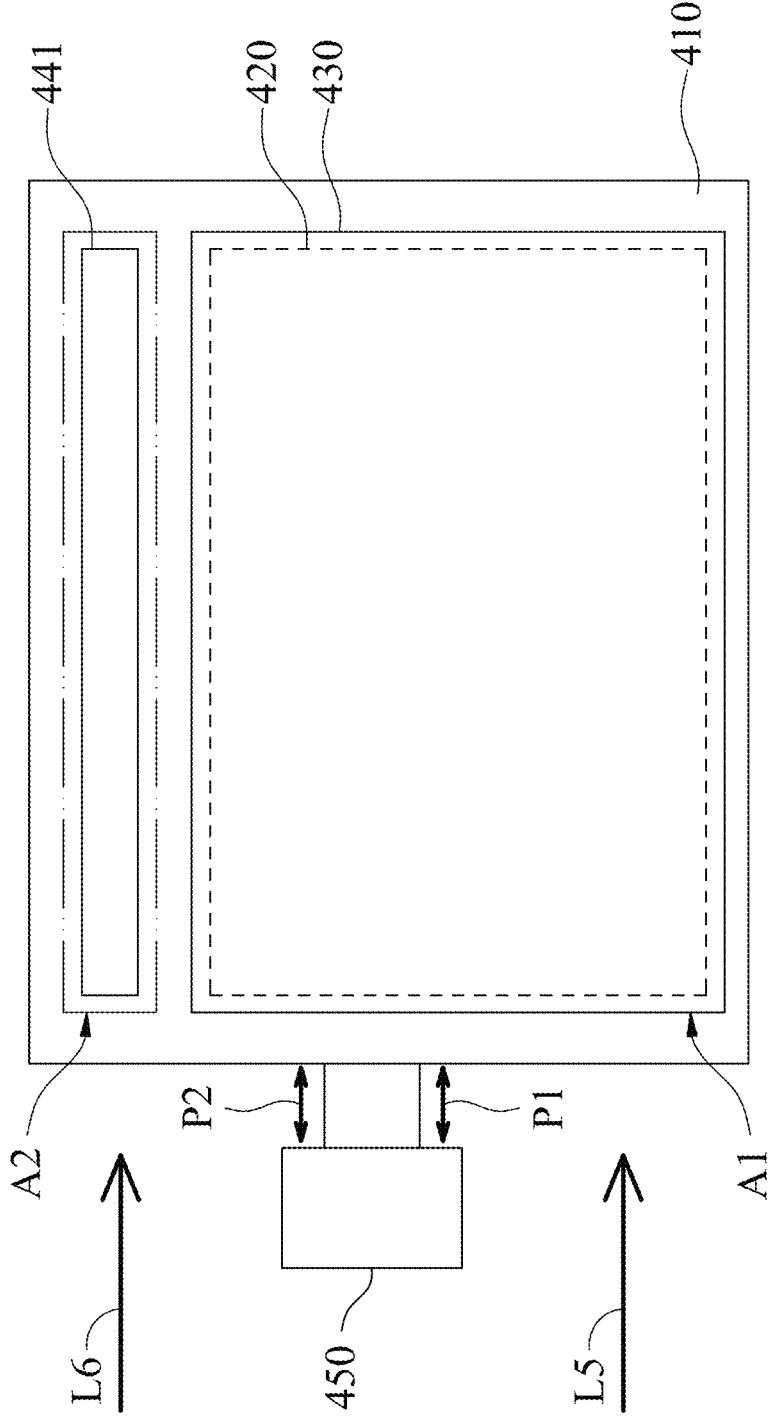
FIG. 7 shows a partially transparent top view of a self-powered display device according to a second example of the second embodiment of the present disclosure.

Please refer to FIG. 7. FIG. 7 shows a partially transparent top view of a self-powered display device according to a second example of the second embodiment of the present disclosure. As shown in FIG. 7, a self-powered display device 400 includes a substrate 410, a first photoelectric conversion unit 420, a light-transmitting display module 430, a second photoelectric conversion unit 441 and a power storage module 450, and the second photoelectric conversion unit 441 is the same as the first photoelectric conversion unit 420. Each component of the self-powered display device 400 is the same as the corresponding component in the self-powered display device 300 in FIG. 4, so the same structural configurations and component functions are not be described again.

Different from the self-powered display device 300, the self-powered display device 400 does not have a retroreflector installed on the substrate 410. Specifically, in application fields where wireless charging is not required, the retroreflector can be removed from the non-display region A2 of the substrate 410. The first photoelectric conversion unit 420 located in the display region A1 can convert a first light L5 incident from the outside of the self-powered display device 400 into a first electrical energy P1, and a wavelength range of the first light L5 is between 400 nm and 800 nm. In particular, the second photoelectric conversion unit 441 located in the non-display region A2 can also directly absorb a second light L6 with a wavelength range between 400 nm and 800 nm, and convert the second light L6 into a second electrical energy P2, which represents both of the first photoelectric conversion unit 420 and the second photoelectric conversion units 441 can absorb and convert ambient light, thereby achieving the purpose of increasing power generation.

In summary, the self-powered display device of the present disclosure has the following advantages. First, by installing the wireless charging module in the non-display region with the small screen ratio, the wireless charging function can be used to increase the total self-powered power generation. Second, when wireless charging is not needed, the self-powered display device still has high power generation even if the retroreflector is removed directly from the substrate. Third, disposing solar cells with the same type on the display region and the non-display region can achieve the effects of simple manufacturing process, low cost and simplified circuit design inside the device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A self-powered display device, comprising:
a substrate having a display region and a non-display region;
a first photoelectric conversion unit disposed on the substrate and located in the display region;
a light-transmitting display module stacked on the first photoelectric conversion unit and configured to receive a first light, wherein the first light penetrates the light-transmitting display module and enters the first photoelectric conversion unit, and the first photoelectric conversion unit converts the first light into a first electrical energy and provides the first electrical energy to the light-transmitting display module; and
a wireless charging module disposed on the substrate and located in the non-display region, wherein the wireless charging module is configured to receive a second light and converts the second light into a second electrical energy, and the wireless charging module provides the second electrical energy to the light-transmitting display module;
wherein a wavelength range of the first light is different from a wavelength range of the second light;

wherein the wavelength range of the first light is between 400 nm and 700 nm, and the wavelength range of the second light is between 700 nm and 2500 nm.

2. The self-powered display device of claim 1, further comprising:
a power storage module electrically connected to the first photoelectric conversion unit and the wireless charging module, wherein the power storage module is configured to store the first electrical energy and the second electrical energy and provides the first electrical energy and the second electrical energy to the light-transmitting display module.

3. The self-powered display device of claim 1, wherein the display region is adjacent to the non-display region, and an area of the display region is larger than an area of the non-display region.

4. The self-powered display device of claim 1, wherein an outer peripheral edge of the light-transmitting display module is aligned with the display region.

5. The self-powered display device of claim 1, wherein a projected area of the wireless charging module on the non-display region is the same as an area of the non-display region.

6. The self-powered display device of claim 1, wherein the wireless charging module comprises:
a second photoelectric conversion unit disposed on the substrate; and
a retroreflector detachably disposed on the substrate and covering the second photoelectric conversion unit;
wherein a part of the second light penetrates the retroreflector and enters the second photoelectric conversion unit, and the second photoelectric conversion unit converts the part of the second light into the second electrical energy.

7. The self-powered display device of claim 6, wherein the second photoelectric conversion unit is different from the first photoelectric conversion unit.

* * * * *